(12) United States Patent
Behfar et al.

(10) Patent No.: US 8,290,013 B2
(45) Date of Patent: Oct. 16, 2012

(54) ALGAINN-BASED LASERS PRODUCED USING ETCHED FACET TECHNOLOGY

(75) Inventors: Alex A. Behfar, Irvine, CA (US); Alfred T. Schremer, Freeville, NY (US); Cristian B. Stagarescu, Ithaca, NY (US); Vainateya, Ithaca, NY (US)

(73) Assignee: Binoptics Corporation, Ithaca, NY (US)

( * ) Notice: Subject to any disclaimer, the term of this patent is extended or adjusted under 35 U.S.C. 154(b) by 0 days.

(21) Appl. No.: 13/397,612

(22) Filed: Feb. 15, 2012

(65) Prior Publication Data

US 2012/0149141 A1 Jun. 14, 2012

Related U.S. Application Data

(62) Division of application No. 11/455,636, filed on Jun. 20, 2006, now Pat. No. 8,130,806.

(60) Provisional application No. 60/692,583, filed on Jun. 22, 2005.

(51) Int. Cl.
*H01S 5/00* (2006.01)

(52) U.S. Cl. ............... 372/49.01; 372/43.01; 372/50.1; 372/50.21; 436/712; 436/706

(58) Field of Classification Search ............ 372/49.01, 372/43.01, 50.1, 50.21; 438/712, 706
See application file for complete search history.

(56) References Cited

U.S. PATENT DOCUMENTS 5,995,527 A * 11/1999 Ueta et al. ............... 372/45.01
2002/0094003 A1 * 7/2002 Bour et al. ............... 372/46
* cited by examiner

*Primary Examiner* — Kinam Park
(74) *Attorney, Agent, or Firm* — William A. Blake

(57) ABSTRACT

A process for fabricating AlGaInN-based photonic devices, such as lasers, capable of emitting blue light employs dry etching to form device waveguides and mirrors. The dry etching is preferably performed using a Chemically Assisted Ion Beam Etching (CAIBE) system.

20 Claims, 10 Drawing Sheets

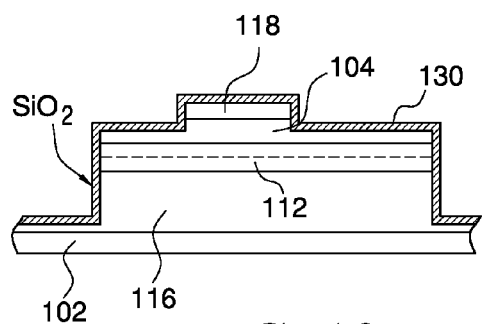
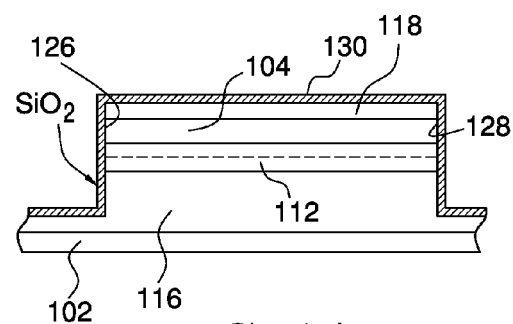
FIG. 13        FIG. 14
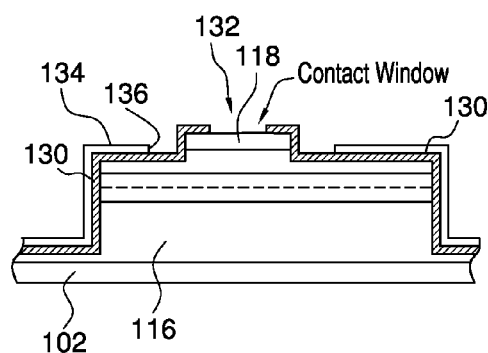
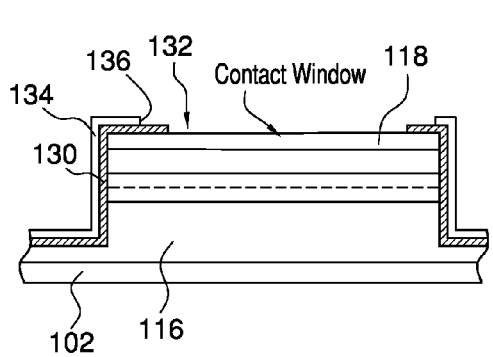
FIG. 15        FIG. 16
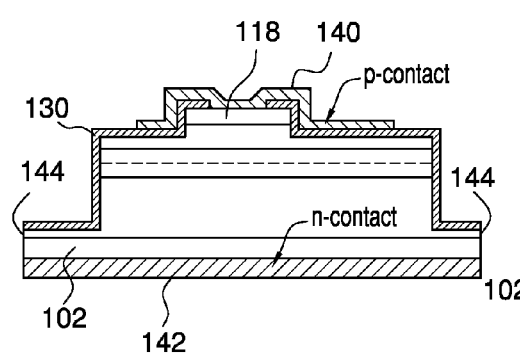
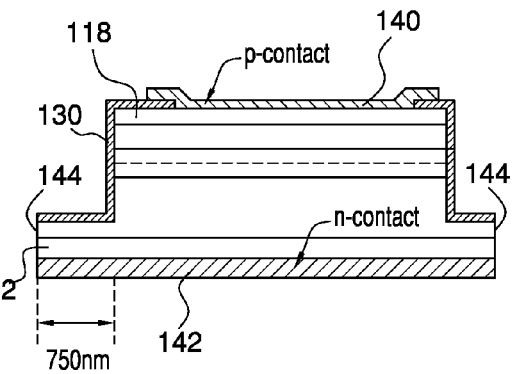
FIG. 17        FIG. 18

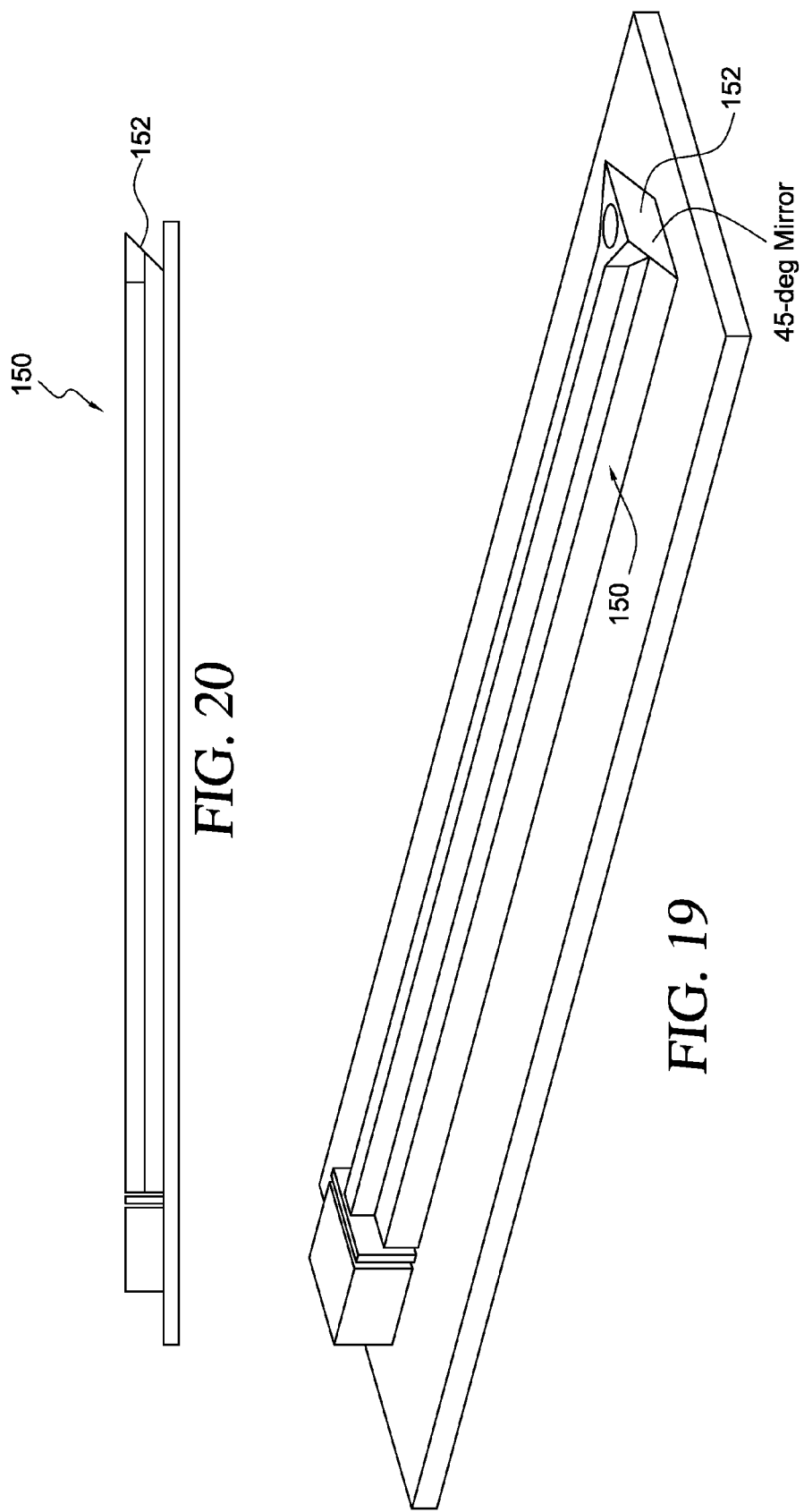

ALGAINN-BASED LASERS PRODUCED USING ETCHED FACET TECHNOLOGY

CROSS REFERENCE TO RELATED APPLICATIONS

This application is a divisional under 35 U.S.C. 120 of U.S. patent application Ser. No. 11/455,636, filed Jun. 20, 2006, now U.S. Pat. No. 8,130,806 which claims the benefit of U.S. Provisional Patent Application No. 60/692,583, filed Jun. 22, 2005, the disclosure of which is hereby incorporated herein by reference.

BACKGROUND OF THE INVENTION

The present invention relates, in general, to a process for fabricating lasers capable of emitting blue light, and, more particularly, to the fabrication of AlGaInN-based lasers utilizing etched facet technology (EFT) for producing laser devices.

Reflective mirrors for edge-emitting semiconductor laser diodes are typically formed at the ends of a laser cavity by mechanical cleaving of a semiconductor crystal. In general, for any semiconductor material, cleaving is an imprecise process compared to photolithography. In addition, it necessitates the handling of fragile bars or miniscule chips for device testing and other subsequent operations. It also tends to be incompatible with monolithic integration because it requires that the wafer be physically broken to obtain fully functional lasers.

Cleaving of GaN is especially problematic. Nichia Chemical first demonstrated GaN-based blue lasers on sapphire substrates in 1995 and has subsequently been able to produce commercially available CW lasers [S. Nakamura, et al. 2000 "The Blue Laser Diode: The Complete Story," Springer-Verlag]. Cleaving is commonly used to form the facets of blue lasers, but the prices of these devices have remained very high. Cleaving the sapphire substrate to form the GaN-based laser facets is particularly difficult, since sapphire has many cleave planes with approximately equal cleave strength within a small angular distance of each other. Because of this, the fracture interface can easily be redirected from one cleavage plane to another, even when perturbations during the cleaving process are small, and when this occurs, the laser is unusable. Despite these problems, sapphire has been the substrate of choice for nitride growth because it is relatively inexpensive and stable during the high temperature processes required for GaN deposition. However, both sapphire and the more expensive SiC substrates are significantly lattice mismatched to GaN, producing high defect densities in the grown material. Free standing GaN substrates are a partial solution, and are just now becoming available, but unlike cubic InP and GaAs, GaN is hexagonal in crystal structure and much harder to cleave. It is therefore expected that cleaving will continue to be a challenging process even with GaN substrates. By using tilted substrates in CAIBE, vertical etched facet blue lasers have been fabricated [Kneissl et al., *Appl. Phys. Lett.* 72, 1539-1541]; however, these lasers were of the stripe or gain-guided kind. Accordingly, there is a need for an improved process for fabricating ridge-type blue lasers in a reliable and cost-effective manner.

A significant factor affecting the yield and cost of GaN-based blue lasers is the lack of availability of laser quality material with low defect density. A few research labs have developed techniques such as epitaxial lateral overgrowth (ELOG) on sapphire that have improved the defect density to the $10^5/cm^2$ level. Because of the difficulty in cleaving, described previously, the minimum cavity length that can be realistically fabricated today is on the order of 600 μm. The use of etched facets in place of mechanically cleaved facets allows the formation of shorter cavity devices of 100 μm or less. The ability to make shorter cavity devices results in a lower probability of having defects in the device and hence produces a much higher yield. These lasers may have a lower maximum power rating than longer cavity devices; however, the vast majority of lasers will be used in next generation DVD read-only applications, where lower power is sufficient and the lowest cost and lowest power consumption will be needed. The specific fabrication, integration and full wafer testing capabilities enabled by EFT will also provide significant benefits to the fabrication of high-power GaN lasers for writable optical disk applications.

BRIEF SUMMARY OF THE INVENTION

In view of the attractiveness of an etched-facet blue-emitting laser from a process yield and cost perspective, as well as its potential for the fabrication of integrated AlGaInN-based photonics, a new EFT process has been developed to achieve facet etching in AlGaInN-based structures. Several years ago, a new technology was pioneered [A. Behfar-Rad, et al. 1989 *Appl. Phys. Lett.* 54, 439-495; U.S. Pat. No. 4,851,3682] in which laser facets were formed using a process based on photolithography definition of a mask and chemically assisted ion beam etching (CAIBE). BinOptics Corporation of Ithaca, N.Y., has developed commercially available InP-based laser products using this Etched Facet Technology (EFT). These products are characterized by precisely located mirrors that have a quality and reflectivity that are equivalent to those obtained by cleaving. With EFT, lasers are fabricated on the wafer in much the same way that integrated circuit chips are fabricated on silicon. This allows the lasers to be monolithically integrated with other photonic devices on a single chip and to be tested inexpensively at the wafer level [P. Vettiger, et al. 1991 *IEEE J. Quantum Electron.* 27, 1319-13314].

A novel and cost-effective way to build a surface-emitting laser using etched facet technology is described in A. Behfar, et al, 2005 *Photonics West*, pages 5737-08. See also co-pending U.S. patent application Ser. No. 10/958,069 of Alex A. Behfar, entitled "Surface Emitting and Receiving Photonic Devices", filed Oct. 5, 2005 (Attys. Dkt. BIN 15); and co-pending U.S. patent application Ser. No. 10/963,739, entitled "Surface Emitting and Receiving Photonic Device With Lens," filed Oct. 14, 2004 (Attys. Dkt. BIN 19) of Alex A. Behfar, et al, both assigned to the assignee of the present application, the disclosures of which are hereby incorporated herein by reference. The described horizontal cavity, surface-emitting laser (HCSEL) is in the form of an elongated cavity on a substrate, and is fabricated by etching a 45° angled facet at the emitter end and a 90° facet at the back end of the cavity. The back end reflective region may incorporate an etched distributed Bragg reflector (DBR) adjacent to the rear facet, or dielectric coatings may be used for facet reflectivity modification (FRM). A monitoring photodetector (MPD) and receiver detectors may also be integrated onto the chip, as described in co-pending U.S. patent application Ser. No. 11/037,334, filed Jan. 19, 2005, of Alex A. Behfar, entitled "Integrated Photonic Devices, assigned to the assignee of the present application.

In accordance with the present invention, lasers are fabricated on a wafer in much the same way that integrated circuit chips are fabricated on silicon, so that the chips are formed in full-wafer form. The laser mirrors are etched on the wafer using the EFT process, and the electrical contacts for the lasers are fabricated. The lasers are tested on the wafer, and thereafter the wafer is singulated to separate the lasers for packaging. Scanning Electron Microscope images of etched AlGaInN-based facets show the degree of verticality and smoothness achieved using newly developed EFT process of the present invention. The present invention allows lasers and integrated devices for a variety of applications with wavelength requirements accessible with AlGaInN-based materials.

The process for fabricating lasers in accordance with the present invention may be summarized as comprising the steps of etching a wafer having an AlGaInN-based structure to fabricate a multiplicity of laser waveguide cavities on the wafer and then etching the laser cavities to form laser facets, or mirrors, on the ends of the waveguides while they are still on the wafer. Thereafter, electrical contacts are formed on the laser cavities, the individual lasers are tested on the wafer, and the wafer is singulated to separate the lasers for packaging. In accordance with the invention, the method of etching the facets includes using a high temperature stable mask on a p-doped cap layer of the AlGaInN-based laser waveguide structures on the wafer to define the locations of the facets, with the mask maintaining the conductivity of the cap layer, and then etching the facets in the laser structure through the mask using a temperature over 500° C. and an ion beam voltage in excess of 500V in CAIBE.

Selectivity between the etching of the semiconductor and the masking material is very important in obtaining straight surfaces for use in photonics. High selectivity between the mask and the GaN based substrate was obtained, in accordance with the present invention, by performing CAIBE at high temperatures. Large ion beam voltages in CAIBE were also found to enhance the selectivity. The mask materials were chosen to withstand the high temperature etching, but also to prevent damage to the p-contact of the GaN-based structure.

BRIEF DESCRIPTION OF THE DRAWINGS

The foregoing, and additional objects, features and advantages of the invention will become apparent to those of skill in the art from the following detailed description of the invention taken with the accompanying drawings, which are briefly described as follows.

FIGS. 6-18 illustrate a process for fabrication of nitride-based ridge lasers with vertical facets using three etching steps in CAIBE, in accordance with the present invention.

FIG. 19 illustrates in perspective view a horizontal cavity, surface-emitting laser (HCSEL), fabricated in accordance with the EFT process of the present invention.

FIG. 20 is a side view of the laser of FIG. 19.

DETAILED DESCRIPTION OF THE INVENTION

Figure 1:
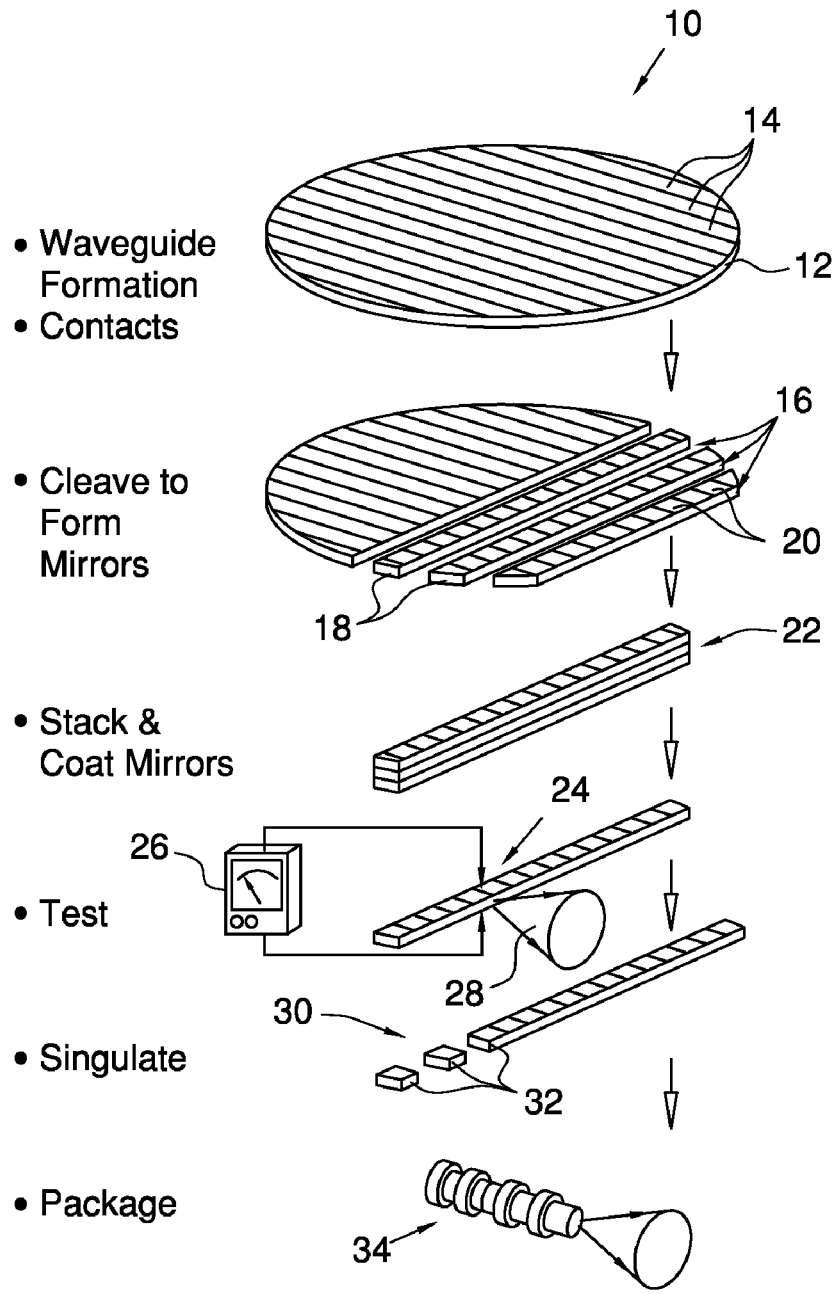
FIG. 1 illustrates a prior art laser fabrication process, wherein laser facets are cleaved.

As generally illustrated at 10 in FIG. 1, mechanical cleaving of a semiconductor epi wafer 12 is the usual process for defining reflective mirrors, or facets, at the cavity ends of edge-emitting diode lasers. In this process, multiple waveguides 14 are fabricated on the wafer substrate, a metal contact layer is applied, and the wafer is mechanically cleaved, as along cleave lines 16, to form bars 18 of laser devices 20. The bars 18 are then stacked, as illustrated at 22, and the cleaved end facets of the laser devices are coated to provide the desired reflection and emission characteristics. The individual laser devices 20 may then be tested, as at 24, by applying a bias voltage 26 across the individual lasers, and detecting the resulting output light beam 28. The bars of laser devices may then be separated, or singulated, as at 30, to produce individual chips 32 that may be suitably packaged, in known manner, as at 34.

For most semiconductor devices, however, the foregoing cleaving process is imprecise, for it relies on the location and angle of the crystalline planes of the semiconductor material. With some materials, for example, there may be cleave planes of approximately equal strength that are oriented at such acute angles to one another that minute perturbations occurring during cleaving can redirect a fracture interface from one cleave plane to another. Furthermore, the cleaving process illustrated in FIG. 1 creates fragile bars and minuscule chips that are awkward to handle during testing and packaging. In addition, mechanical cleaving tends to be incompatible with later processing of the individual chips, as would be needed to provide a monolithic integration of components on a chip, for example, since the wafer must physically be broken to obtain fully functional lasers.

Figure 2:
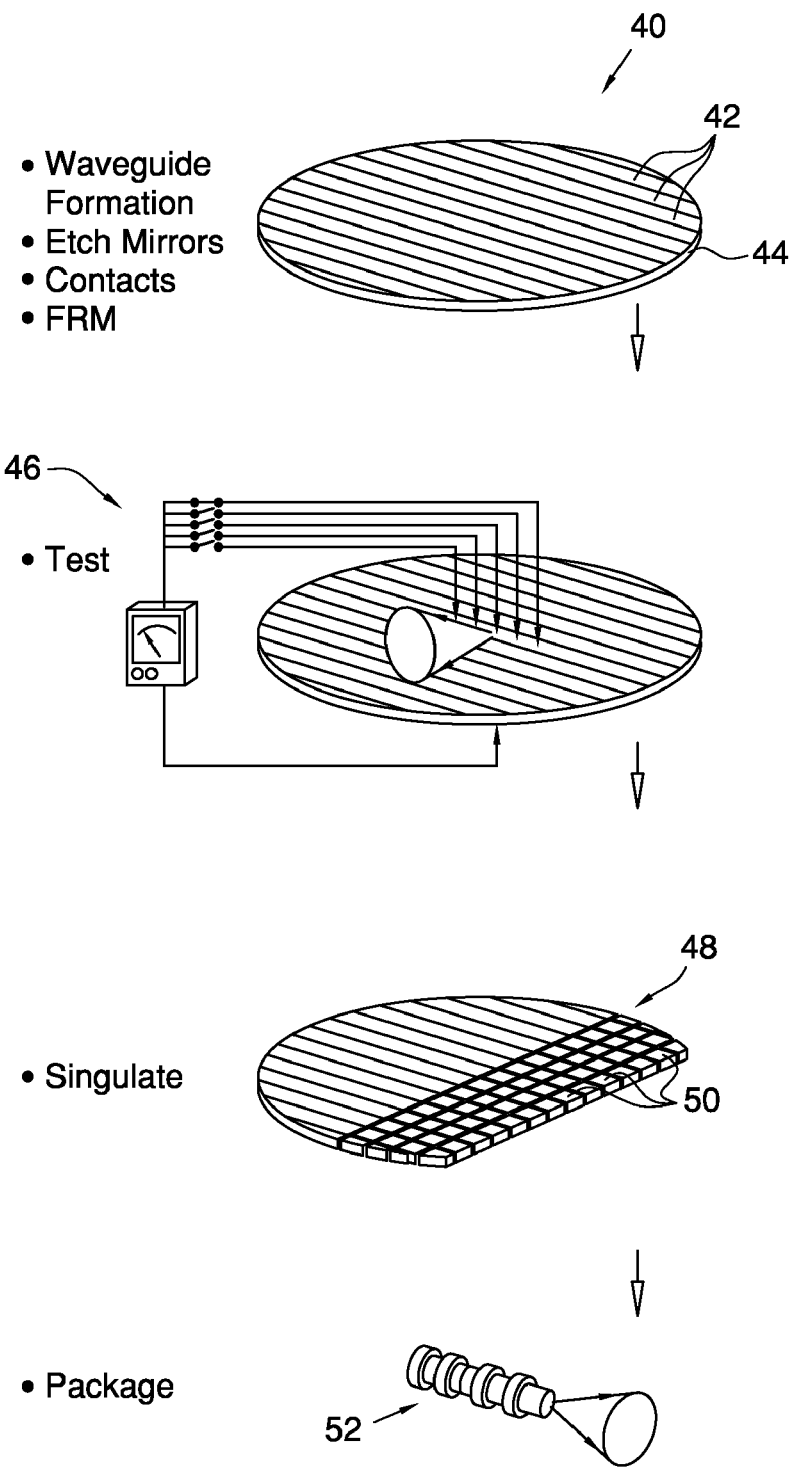
FIG. 2 illustrates a prior art laser fabrication process with on-wafer testing made possible by etching of the laser facets.

An alternative prior art technology for fabricating photonic devices such as lasers is generally illustrated at 40 in FIG. 2, wherein multiple waveguides 42 are fabricated on a suitable wafer substrate 44. These are preferably parallel waveguides that extend across the wafer, as illustrated. A process based on photolithography and chemically-assisted ion-beam etching (CAIBE) is then used to form facets at desired locations along the waveguides to produce laser waveguide cavities. These facets are precisely located, and have a quality and reflectivity that is equivalent to those obtained by cleaving. Since the laser cavities and facets are fabricated on the wafer much the same way that integrated circuits are fabricated on silicon, this process allows the lasers to be monolithically integrated with other photonic devices on a single chip, and allows the devices to be tested inexpensively while still on the wafer, as indicated at 46. Thereafter, the wafer may be singulated, as at 48, to separate the chips 50, and the chips may then be packaged, as illustrated at 52. This process has a high yield and low cost, and also allows the manufacture of lasers having very short cavities. The prior art fabrication process of FIG. 2 is described in greater detail in "Monolithic AlGaAs—GaAs Single Quantum-Well Ridge Lasers Fabricated with Dry-Etched Facets and Ridges", A. Behfar-Rad and S. S. Wong, IEEE Journal of Quantum Electronics, Vol. 28, pp. 1227-1231, May 1992.

In accordance with the present invention, lasers are fabricated utilizing the general process illustrated in FIG. 2, but on a wafer with an AlGaInN-based epitaxial structure 44, in much the same way that integrated circuit chips are fabricated on silicon, so that the chips are formed in full-wafer form. The laser mirrors are etched on the wafer using the new etched facet technology EFT of the invention, and the electrical contacts for the lasers are fabricated on the laser cavities on the wafer. The lasers are tested on the wafer, and thereafter the wafer is singulated to separate the lasers for packaging, in the manner described above. Scanning Electron Microscope images of etched AlGaInN-based facets show that a high degree of verticality and smoothness can be achieved using the EFT process of the present invention. The present invention permits the fabrication of lasers and integrated devices for a variety of applications having wavelength requirements accessible by AlGaInN-based materials.

As will be described in greater detail below, in the process of the present invention, a AlGaInN-based laser structure is epitaxially deposited on a substrate and contains a lower cladding of n-doped AlGaN, an active region with quantum wells and barriers of AlGaInN (Al and/or In can be zero in this composition), an upper cladding layer of p-doped AlGaN, and a highly p-doped cap layer of GaN and/or GaInN.

A layer of PECVD $SiO_2$ is deposited on the nitride-based laser structure. Lithography and RIE is performed to pattern the $SiO_2$ to provide an $SiO_2$ mask that is used to define laser facets and laser mesas. For each laser, a ridge is formed, first by lithography and removal of $SiO_2$ in regions other than the location of the ridge through RIE, and then through CAIBE, which is once again used to form the ridges. The samples are encapsulated with PECVD $SiO_2$, a contact opening is formed, and a p-contact is formed on top of the wafer, followed by the n-contact on the bottom.

Figure 3:
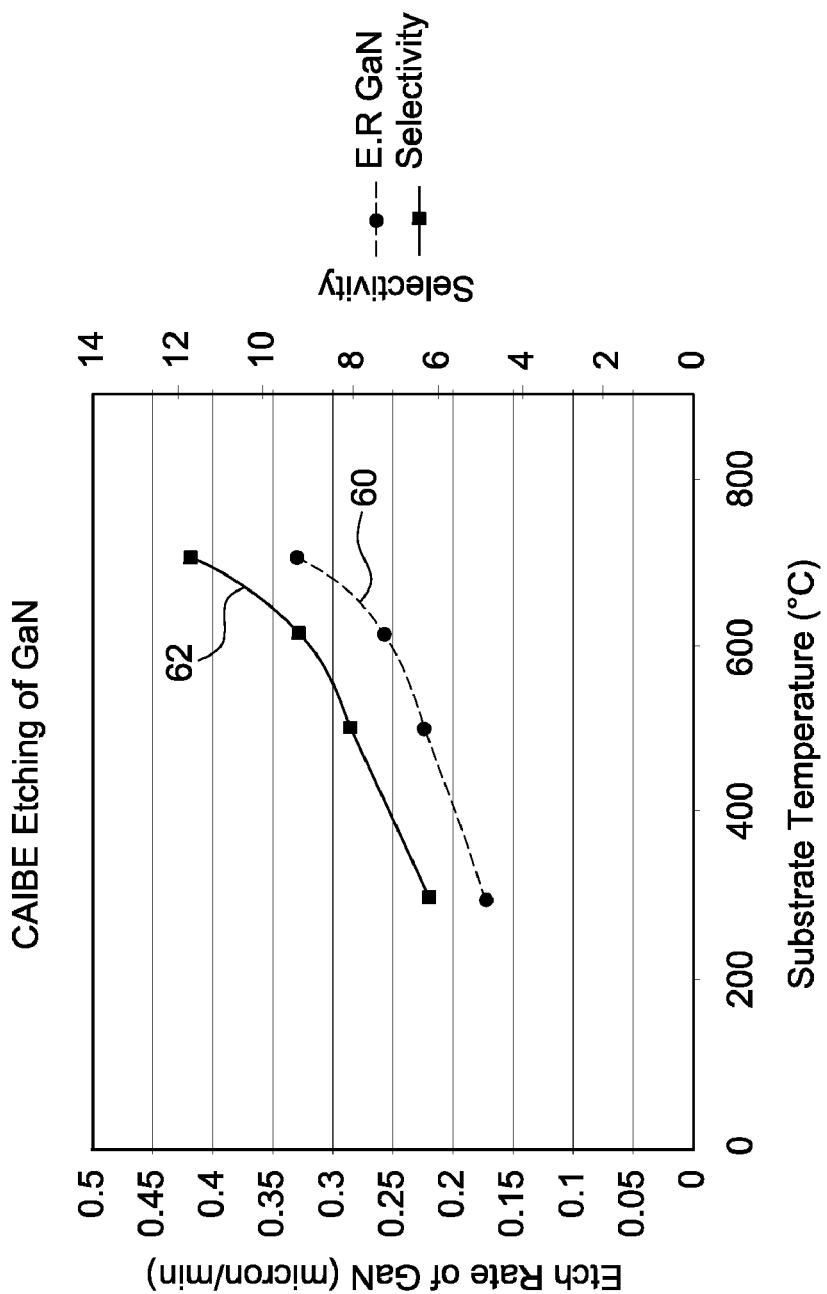
FIG. 3 is a graph illustrating the effect of temperature in CAIBE at constant ion beam current density and voltage on GaN etch rate and on the selectivity of the etching of GaN to erosion of the $SiO_2$ mask.

In a preferred form of the process of the invention, the etching in CAIBE is carried out at a temperature of between about 500° C. and about 700° C., and with an ion beam voltage of between 500 V and 2000 V to provide improved selectivity. FIG. 3 illustrates at curve 60 the effect on the etch rate, or etch rate gain, of GaN with temperature in CAIBE while the ion beam voltage, beam current density, and the flow of Chlorine are kept constant at 1100 V, 0.35 mA/cm$^2$, and 20 sccm. This figure also illustrates at curve 62 the etch selectivity between GaN and the $SiO_2$, and shows that the selectivity improves with increasing temperature with a selectivity of over 10:1 being obtained around 700° C. However, at temperatures of beyond 700° C., the GaN facet begins to exhibit a pitting behavior and this pitting is exacerbated at higher temperatures.

Figure 4:
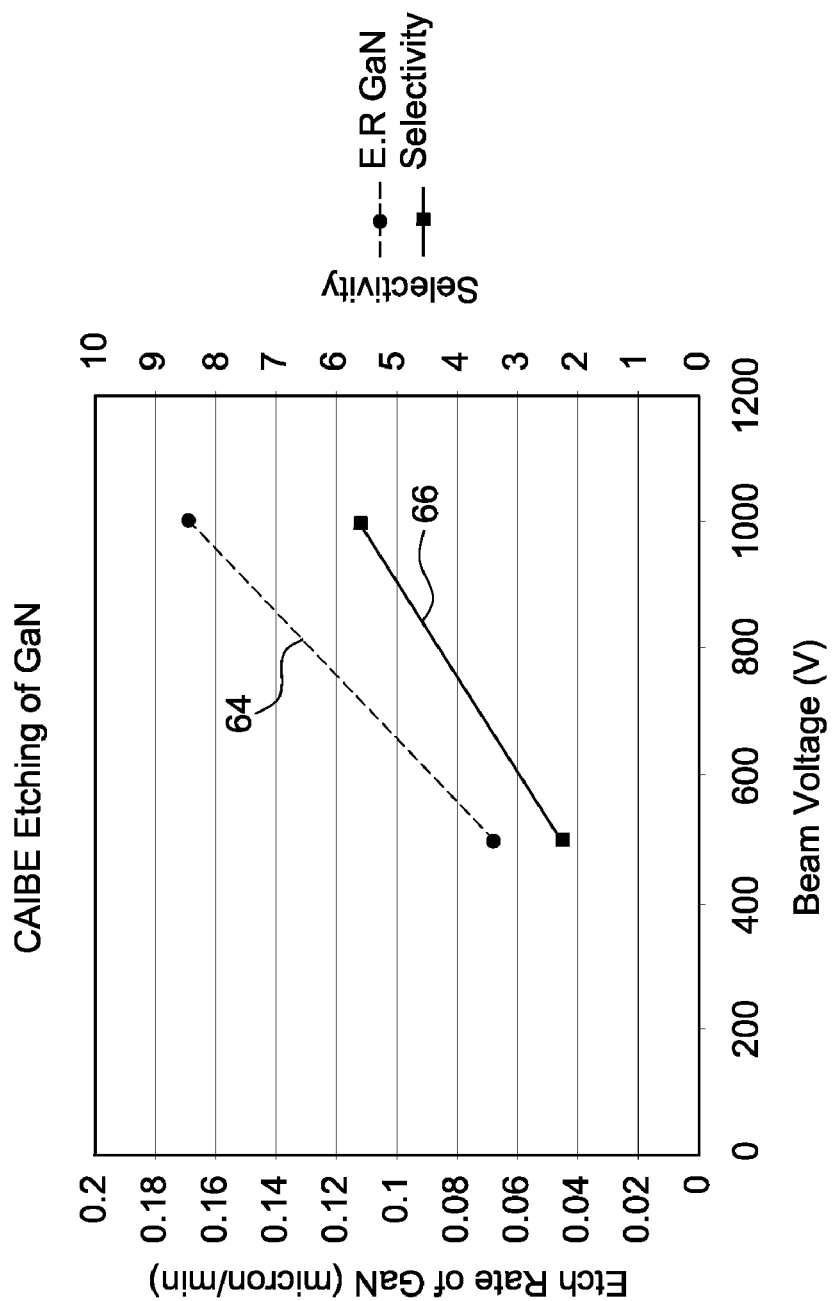
FIG. 4 is a graph illustrating the effect of ion beam voltage in CAIBE at constant temperature and constant ion beam current density on GaN etch rate and on the selectivity of the etching of GaN to erosion of the $SiO_2$ mask.

FIG. 4 illustrates at curve 64 the effect on the etch rate of GaN with beam voltage in CAIBE while the temperature, ion beam current density, and the flow of Chlorine are kept constant at 275° C., 0.30 mA/cm$^2$, and 20 sccm. This figure also illustrates at curve 66 the etch selectivity between GaN and the $SiO_2$, and shows that the selectivity improves with increasing beam voltage.

Figure 5:
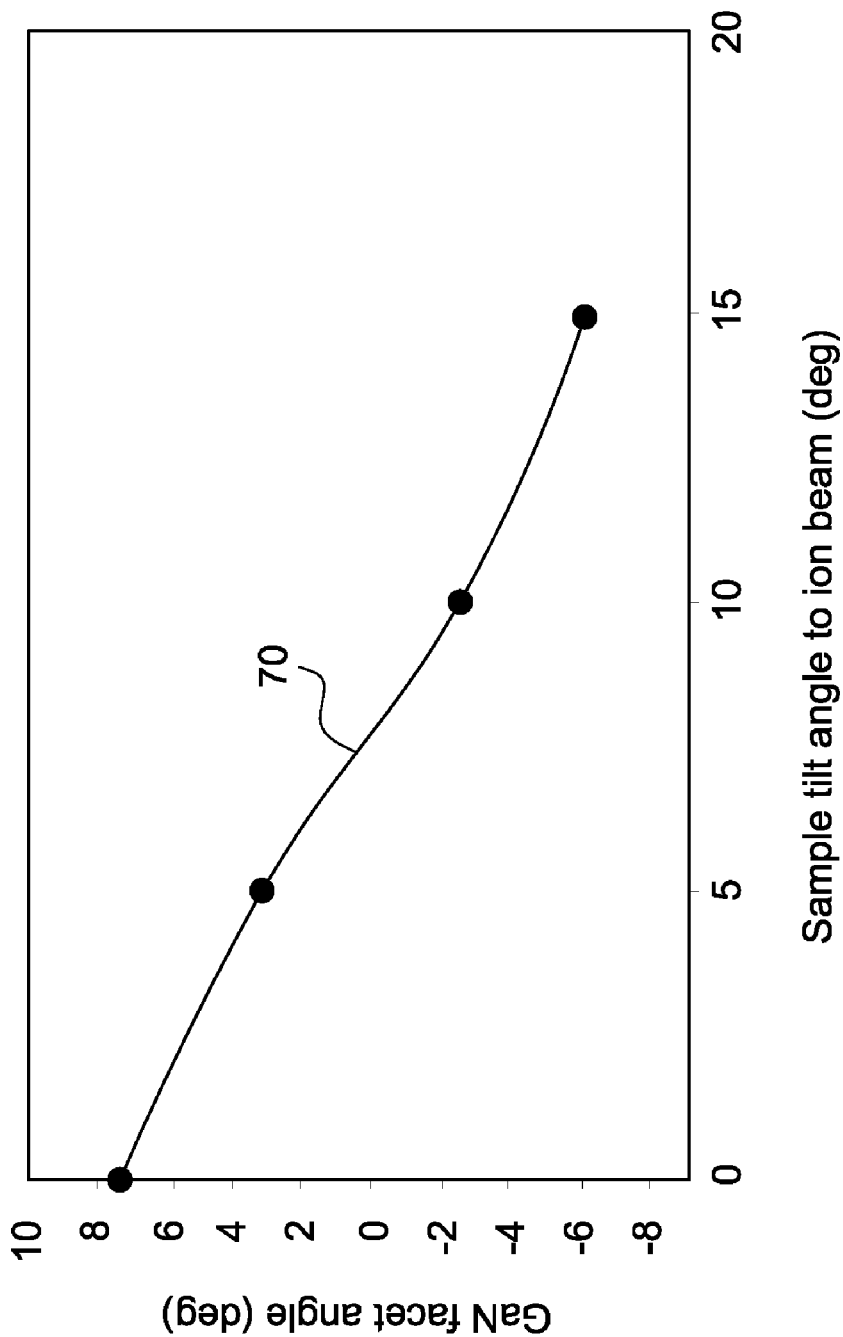
FIG. 5 shows the angle of the GaN facet with respect to the normal to the substrate with the different tilt angles used during CAIBE.

Under CAIBE conditions where lower etch selectivity between GaN and the $SiO_2$ is obtained, the etched facet may be formed at an angle away from the perpendicular to the substrate, but this can be compensated for by etching at an angle in the CAIBE system. In this case, the sample is positioned at an angle to the ion beam that is away from perpendicular incidence. Curve 70 in FIG. 5 shows the facet angle as a function of the tilt in the CAIBE sample holder stage. The conditions used for generating the data in FIG. 5 were an ion beam voltage of 1250 V; ion current density of 0.3 mA/cm$^2$; 20 sccm flow of $Cl_2$; and substrate stage temperature of 700° C.

Figure 6:
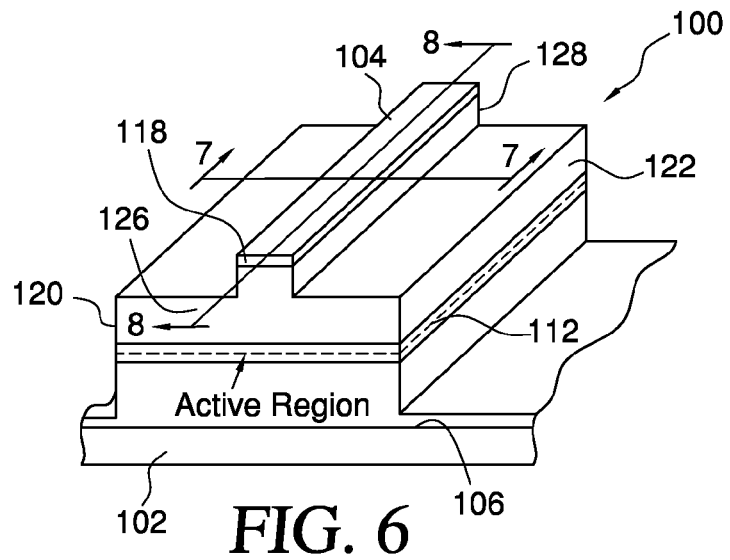

Turning now to a more detailed description of the process of the invention, a Fabry-Perot laser waveguide 100, shown in perspective view in FIG. 6, is fabricated using the process steps of FIGS. 7 to 18, wherein a process for fabricating a highly reliable AlGaInN-based blue laser waveguide on a substrate 102 is illustrated. Although the invention will be described in terms of a laser having a ridge such as that illustrated in FIG. 6 at 104, it will be understood that other types of lasers or other photonic devices may also be fabricated using this process.

Figure 7:
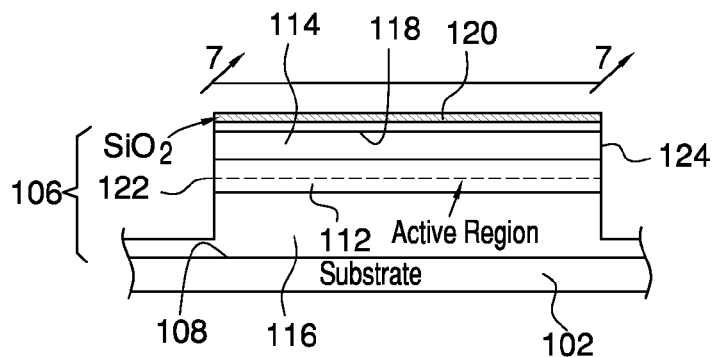
Figure 8:
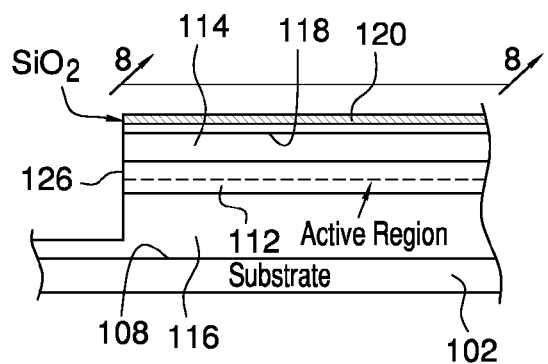
Figure 9:
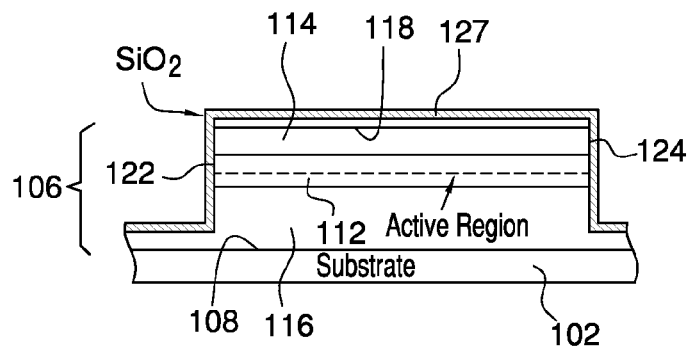

As is conventional, the substrate 102 may be a wafer formed, for example, of a type III-V type compound, or an alloy thereof, which may be suitably doped. As illustrated in FIGS. 7 and 8, which are views of the device of FIG. 6 taken in the direction of lines 7-7 and 8-8, respectively, a succession of layers 106 may be deposited on a top surface 108 of the substrate 102, as by epitaxial deposition using Metalorganic Chemical Vapor Deposition (MOCVD) or Molecular Beam Epitaxy (MBE), for example. These layers may then be etched to form optical waveguides, such as the waveguides 42 illustrated in FIG. 2 or the waveguide 100 illustrated in FIG. 6, that typically include an active region 112 and upper and lower cladding regions 114 and 116, as illustrated in FIGS. 7 and 8. It is noted that FIGS. 7, 9, 11, 13 and 15 are end views taken in the direction of the arrows 7-7 of the waveguide 100 of FIG. 6, while FIGS. 8, 10, 12, 14 and 16 are cross-sectional views of the waveguide 100 taken in the direction of arrows 8-8 of FIG. 6.

In one example, the layers 106 of the AlGaInN-based semiconductor laser photonic device 100 were epitaxially formed on an n-doped GaN substrate 102, and contained a lower cladding region 116 of n-doped AlGaN, an active region 112 with quantum wells and barriers of AlGaInN (Al and/or In can be zero in this composition), an upper cladding layer 114 of p-doped AlGaN, and a highly p-doped cap layer 118 of GaN and/or GaInN. The upper and lower cladding regions 114 and 116, respectively, of the photonic structure had a lower index than the index of the active region 112, while the GaN and/or GaInN cap layer 118 was provided to allow ohmic contacts. Although this example is based on providing a blue laser device on a GaN substrate, it will be understood that these devices can be formed on other substrates such as Sapphire, SiC or AN.

Figure 10:
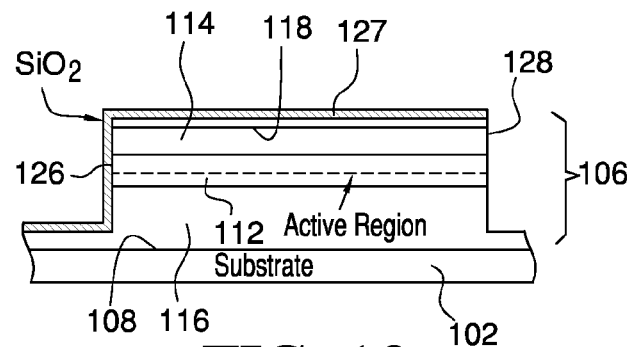

A layer 120 of a dielectric such as $SiO_2$ is deposited on the nitride-based laser structure, as by plasma enhanced chemical vapor deposition (PECVD), photolithography is used to define the position of the facets in a spun-on photoresist layer, and a $CHF_3$ reactive ion etch (RIE) is used to transfer the pattern in the photoresist into the $SiO_2$ to produce a mask. The photoresist is removed with an oxygen plasma and the sample is placed in a $Cl_2$-based chemically assisted ion beam etch (CAIBE) at an appropriate substrate tilt to allow the formation of a first vertical facet 126, as shown in FIG. 8. The CAIBE parameters may be as follows: 1250 eV Xe ions at a current density of 0.3 mA/cm$^2$, $Cl_2$ flow rate of 20 sccm, and a substrate stage temperature of 650° C. The etch is deep enough to form an adequate facet surface for the vertical waveguide of the laser. The remaining $SiO_2$ mask 120 is removed using buffered HF, and a new layer 127 of PECVD $SiO_2$ is deposited on the nitride-based laser structure, covering the first etched vertical facet 126. A second photolithography is used to define the position of a second facet in a photoresist layer, and RIE is used to transfer the photoresist pattern into the $SiO_2$. The photoresist is removed and the sample is placed in CAIBE at an appropriate substrate tilt to allow the formation of the second vertical facet 128, as shown in FIG. 10. As in the case of the first etched facet, the etch for the second facet is deep enough to form an adequate facet surface for the vertical waveguide of the laser. The first facet 126 is protected by the $SiO_2$ mask 127 during the formation of the second facet.

Figure 11:
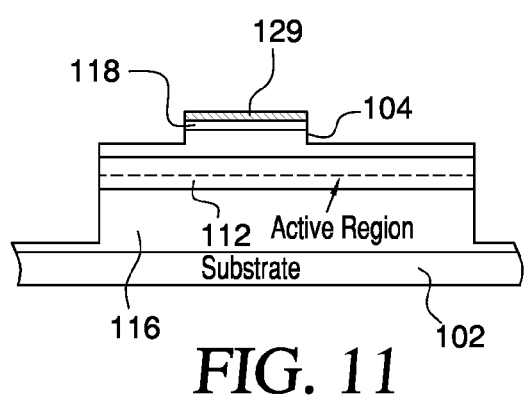
Figure 12:
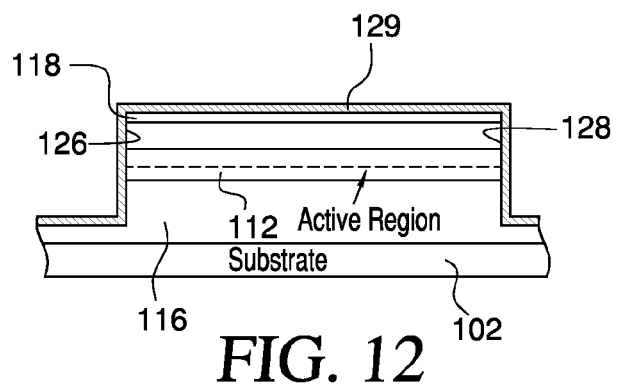

The remaining SiO$_2$ mask 127 is removed and a new layer 129 of PECVD SiO$_2$ is deposited on the nitride-based laser structure, covering the first and second etched vertical facets. Photolithography is used to define the position of the ridge 104 in photoresist and RIE is used to transfer the photoresist pattern into the SiO$_2$ layer 129. The photoresist is removed, and the sample is placed in CAIBE with the substrate essentially perpendicular to the ion beam for the formation of the ridge, as illustrated in FIGS. 11 and 12. The ridge 104 provides lateral waveguiding for the blue laser structure.

The remaining SiO$_2$ mask 129 is removed and a new layer 130 of PECVD SiO$_2$ is deposited to encapsulate the structure, as shown in FIGS. 13 and 14. Photolithography is used to define the position of an opening 132 on top of the ridge in the photoresist and RIE is used to partially transfer the hole in the photoresist into the SiO$_2$, as illustrated in FIGS. 15 and 16 to form a mask. Residual SiO$_2$ is removed from the opening 132, using buffered HF, so that the highly doped surface of the contact layer 118 of the nitride based laser structure is exposed. In this way, RIE does not damage the surface of the highly doped contact layer 118. A p-contact 140 is deposited, using metallization lift-off pattern 134 as shown in FIGS. 15 and 16, to cover the opening 132, and an n-contact 142 is either formed from the same side as the p-contact using metallization lift-off, or in the case that the substrate is conducting, is deposited on the backside of the wafer, as shown in FIGS. 17 and 18. The edges 136 of the lift-off pattern define the p-contact.

The p-contact may be formed in a two step process where a first deposition of a metal, such as 30 nm of Ni followed by 30 nm of Au, is deposited over the opening is performed through metallization lift-off. The first deposition is annealed using a rapid thermal annealer (RTA) at 550° C. in an O$_2$ ambient to form good contact with the nitride-based structure. Then a second deposition of a metal, such as 15 nm of Ti, 500 nm of Pt, and 1000 nm of Au, is performed also through metallization lift-off to provide better conductivity of the p-metal as well as to provide a better base for wirebonding to the p-contact.

Figure 21:
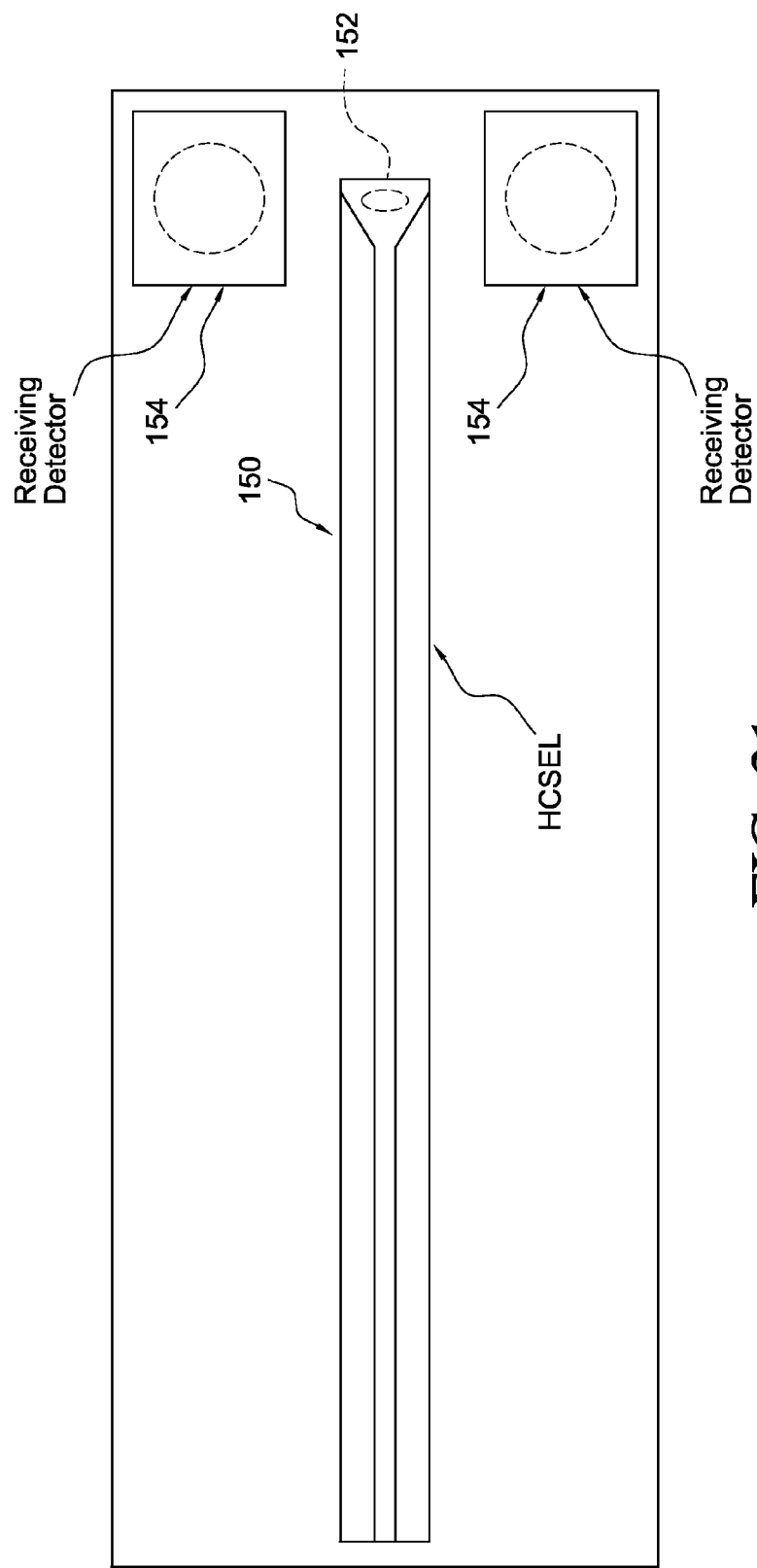
FIG. 21 illustrates the integration of a HCSEL and receiver detectors on a single chip.

The process described with respect to FIGS. 7-10 can be replaced with an angled etch that results in one or both of the facets 126 and 128 being etched at a 45° angle to form a surface emitting device or HCSEL 150, such as that illustrated in FIGS. 19-21. In these figures, the HCSEL incorporates a single 45° angled facet 152, although both facets can be angled, if desired. As illustrated in FIG. 21, one or more receiving detectors 154 can be integrated with the HCSEL 150.

A significant factor affecting the yield and cost of AlGaInN-based blue lasers is the lack of availability of laser quality material with low defect density. A few research labs have developed techniques such as epitaxial lateral overgrowth (ELOG) on sapphire while others have developed GaN substrates that have improved the defect density to the $10^5$/cm$^2$ level. Because of the difficulty in cleaving, described previously, the minimum cavity length that can be realistically fabricated using that procedure is on the order of 600 μm. The use of etched facets in place of mechanically cleaved facets allows the formation of shorter cavity devices of 100 μm or less, and this ability to make shorter cavity devices results in the probability of having fewer defects per device and hence much higher yield. These shorter lasers may have a lower maximum power rating than longer cavity devices; however, the vast majority of lasers will be used in next generation DVD read-only applications, where lower power is sufficient and the lowest cost and lowest power consumption will be needed. The specific fabrication, integration and full wafer testing capabilities enabled by EFT will also provide significant benefits to the fabrication of high-power GaN lasers for writable optical disk applications.

Although the present invention has been illustrated in terms of preferred embodiments, it will be understood that variations and modifications may be made without departing from the true spirit and scope thereof as set out in the following claims.

The invention claimed is:

1. A method for fabricating a laser, comprising the steps of:
   epitaxially depositing an AlGaInN-based structure including an active region on a substrate; and
   dry etching using a system containing an ion beam source generating an ion beam directed towards said substrate:
   a first facet in said AlGaInN-based structure;
   a second facet in said AlGaInN-based structure; and
   a ridge waveguide along a top surface of said AlGaInN-based structure above said active region for providing lateral waveguiding for said laser, said ridge waveguide being located between said first and second facets, said first facet being formed at and extending across a first end of said AlGaInN-based structure and said ridge waveguide in a single plane at or around 90-degrees to said substrate.

2. The method of claim 1, wherein said dry etching is performed using a Chemically Assisted Ion Beam Etching (CAIBE) system.

3. The method of claim 1, wherein said second facet is at or around 90-degrees to said substrate.

4. The method of claim 1, wherein said second facet is at or around 45-degrees to said substrate.

5. The method of claim 1, further comprising the step of forming a contact on a p-doped cap layer.

6. A method for fabricating a laser, comprising the steps of:
   epitaxially depositing on a substrate an AlGaInN-based structure including an active region and a p-doped cap layer at a top surface of said structure;
   dry etching a first facet in said AlGaInN-based structure;
   dry etching a second facet in said AlGaInN-based structure;
   dry etching a ridge waveguide along a top surface of said AlGaInN-based structure above said active region for providing lateral waveguiding for said laser, said ridge waveguide being located between said first and second facets;
   depositing a dielectric above said ridge waveguide and covering said p-doped cap layer; and
   forming an opening using both dry etching and wet etching in said dielectric, exposing said p-doped cap layer.

7. The method of claim 6, wherein said dry etching is performed using a Chemically Assisted Ion Beam Etching (CAIBE) system.

8. The method of claim 6, wherein the length of the ridge waveguide between said first and second facets is 100 μm or less.

9. The method of claim 6, wherein said dielectric completely encapsulates said etched facets.

10. The method of claim 6, further comprising forming a contact on said p-doped cap layer.

11. A method of fabricating a photonic device, comprising the steps of:
   epitaxially depositing an AlGaInN-based structure including an active region on a substrate;
   dry etching a first facet in said AlGaInN-based structure; and
   dry etching a ridge waveguide along a top surface of said AlGaInN-based structure above said active region for providing lateral waveguiding, said first facet being formed at and extending across a first end of said AlGaInN-based structure and said ridge waveguide in a single plane at or around 90-degrees to said substrate.

12. The method of claim 11, further comprising the step of dry etching a second facet in said AlGaInN-based structure.

13. The method of claim 12, wherein said second facet is at or around 90-degrees to said substrate.

14. The method of claim 12, wherein said second facet is at or around 45-degrees to said substrate.

15. The method of claim 14, wherein the distance between said first and second facets is 100 μm or less.

16. A method of fabricating a photonic device, comprising the steps of:
   epitaxially depositing on a substrate an AlGaInN-based structure including an active region and a p-doped cap layer at a top surface of said structure;
   dry etching a first facet in said AlGaInN-based structure;
   dry etching a ridge waveguide along a top surface of said AlGaInN-based structure above said active region for providing lateral waveguiding for said laser;
   depositing a dielectric above said ridge waveguide and covering said p-doped cap layer; and
   forming an opening using both dry etching and wet etching in said dielectric, exposing said p-doped cap layer.

17. The method of claim 16, wherein said dry etching is performed using a Chemically Assisted Ion Beam Etching (CAIBE) system.

18. The method of claim 16, wherein the length of the ridge waveguide between said first and second facets is 100 μm or less.

19. The method of claim 16, wherein said dielectric completely encapsulates said etched facets.

20. The method of claim 16, further comprising the step of forming a contact on said p-doped cap layer.

* * * * *